US007221163B2

(12) United States Patent
Vester

(10) Patent No.: US 7,221,163 B2
(45) Date of Patent: May 22, 2007

(54) MAGNETIC RESONANCE SYSTEM WITH SUPPRESSION OF CAPACITIVE COUPLING BETWEEN AN RF SOURCE AND THE SUBJECT

(75) Inventor: Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/387,486

(22) Filed: Mar. 22, 2006

(65) Prior Publication Data

US 2006/0238197 A1 Oct. 26, 2006

(30) Foreign Application Priority Data

Mar. 22, 2005 (DE) ..................... 10 2005 013 293

(51) Int. Cl.
*G01V 3/00* (2006.01)

(52) U.S. Cl. ...................................... 324/318; 324/322

(58) Field of Classification Search ........ 324/300–322; 600/410–424

See application file for complete search history.

(56) References Cited

U.S. PATENT DOCUMENTS 4,620,155 A * 10/1986 Edelstein .................... 324/322
6,028,429 A * 2/2000 Green et al. ................ 324/318
7,038,453 B2 * 5/2006 Feiweier et al. ............ 324/314
2006/0255800 A1 * 11/2006 Feiweier et al. ............ 324/307

FOREIGN PATENT DOCUMENTS

WO WO 03/025608 3/2003

* cited by examiner

*Primary Examiner*—Brij B. Shrivastav
(74) *Attorney, Agent, or Firm*—Schiff Hardin LLP

(57) ABSTRACT

A magnetic resonance system has a transmission antenna that excited magnetic resonance signals in an examination subject arranged in an examination volume, a radio-frequency source that is stationary or mobile in the examination volume or in its surroundings and by means of which an electrical field oscillating at the excitation frequency can be generated. A barrier is arranged between the radio-frequency source and the examination volume—the barrier formed of a number of individual resonators that are respectively inherently resonant at the excitation frequency. The examination volume is shielded by the barrier from the electrical field generated by the radio-frequency source. Each individual resonator has two capacitor surfaces of which one faces toward the radio-frequency source and the other faces the examination volume, and they are connected with one another in an electrically-conductive manner via a coil. The capacitor surface facing toward the radio-frequency source and/or the capacitor surface facing toward the examination volume are not directly connected with one another in an electrically-conductive manner.

16 Claims, 5 Drawing Sheets

1
2
3
4
5
6
7
8

MAGNETIC RESONANCE SYSTEM WITH SUPPRESSION OF CAPACITIVE COUPLING BETWEEN AN RF SOURCE AND THE SUBJECT

BACKGROUND OF THE INVENTION

1. Field of the Invention

The present invention concerns a magnetic resonance system with a transmission antenna and a radio-frequency source having a sheath wave barrier or trep in a cable between the radio-frequency source and the examination volume.

2. Description of the Prior Art

PCT Application WO 03/025608 discloses a magnetic resonance system wherein an examination subject arranged in an examination volume can be excited to magnetic resonance with an excitation frequency by means of a transmission antenna, operated by a radio-frequency source, with the radio-frequency source having stationary or mobile in the examination volume or in its surroundings.

An electrical field oscillating at the excitation frequency is generated by the radio-frequency source.

A barrier is arranged between the radio-frequency source and the examination volume, the barrier being formed of individual resonators that are each naturally resonant at the excitation frequency.

The examination volume is shielded by means of the barrier from the electrical field generated by the radio-frequency source.

The radio-frequency source is fashioned as a cable in this known magnetic resonance system. The barrier essentially represents a further development of a known sheath wave barrier.

The transmission antennas of a magnetic resonance system should generate a magnetic excitation field in an examination subject (generally a person) to cause magnetic resonance excitatism in the examination subject. After the magnetic resonance excitatism it is possible to receive the emitted magnetic resonances by means of suitable reception antennas. The transmission antenna itself can possibly be used for reception.

Eddy currents, which lead to an unwanted heating of the examination subject, are always associated with the generation of the magnetic excitation field. These eddy currents cannot be prevented. Currents having electrical fields that are capacitively coupled into the examination subject and lead to a further heating of the examination subject are also generated in addition to these unavoidable eddy currents. Such capacitive couplings in particular occur at the conductors of the transmission antenna, but can also occur (albeit to a lesser extent) at local receiver coils or at cables insofar as these are located in the effective range of the transmission antenna. All of these elements (transmission antenna, local coil, cable) can thus act as (unwanted) radio-frequency sources whose electrical fields should optimally be kept away from the examination subject.

A direct and (without further measures) intrusive approach is to make the distance of the radio-frequency source from the examination subject optimally large. This leads, for example, either to over-dimensioned transmission antennas in the case of whole-body transmission antennas, or to a reduction of the spatial relationships (which are limited anyway) in the examination volume. An enlarged distance in the reception case also leads to a reduced sensitivity, even for local coils.

It would also be possible to divide the resonance capacitors in the transmission and/or reception antennas (known as "multiple reduction"). This leads, however, to increased capacitor losses and moreover to an additional production expenditure. Furthermore, this solution is not applicable in all cases.

SUMMARY OF THE INVENTION

An object of the present invention is to suppress unwanted capacitive couplings of the radio-frequency source in a magnetic resonance examination subject and, at the same time, to avoid the disadvantages of the prior art. In particular the individual resonators should be fashioned simply and effectively.

This object is achieved by a magnetic resonance system of the aforementioned type wherein each individual resonator has two capacitor surfaces, of which one faces toward the radio-frequency source and the other faces toward the examination volume, and that are connected with one another in an electrically-conductive manner via a coil, and wherein the capacitor surfaces facing towards the radio-frequency source and/or the capacitor surfaces facing towards the examination volume are not directly connected with one another in an electrically-conductive manner.

This arrangement causes currents in the barrier that compensate the displacement current caused by the radio-frequency source in the examination subject.

As already mentioned, the radio-frequency source is normally the same as the transmission antenna. In individual cases it is also possible that the radio-frequency source is fashioned as a local coil for reception of magnetic resonances excited in the examination subject or as a cable.

The individual resonators alternatively can be insulated from one another or electrically connected with one another. Hybrids are also possible.

The capacitor surfaces are connected with the coils via connection points. The capacitor surfaces advantageously extend essentially in one plane and have extensions extending radially in the plane relative to the connection points. The capacitor surfaces can be star-shaped.

The individual resonators alternatively can be irregularly or regularly distributed. In the latter case, the individual resonators can define, for example, a rectangular or a hexagonal pattern.

A dielectric is normally arranged between the capacitor surfaces. In this case it is possible for the dielectric to function as a carrier or supporting structure for the capacitor surfaces and the coils. Preferably it extends across a number of individual resonators.

Alternatively, essentially only air can be located between the capacitor surfaces of the individual resonators. For example, spacers can be provided in places between the capacitor surfaces or a bearing structure for the individual resonators can be provided as a foam packing sheet.

The radio-frequency source normally also emits an alternating magnetic field. In this case, the coils are oriented such that the alternating magnetic field induces no currents in them. Alternatively, the coils of the individual resonators can be fashioned such that currents induced in the coils by the alternating magnetic field mutually generate compensating induction voltages.

DESCRIPTION OF THE PREFERRED EMBODIMENTS

Figure 1:
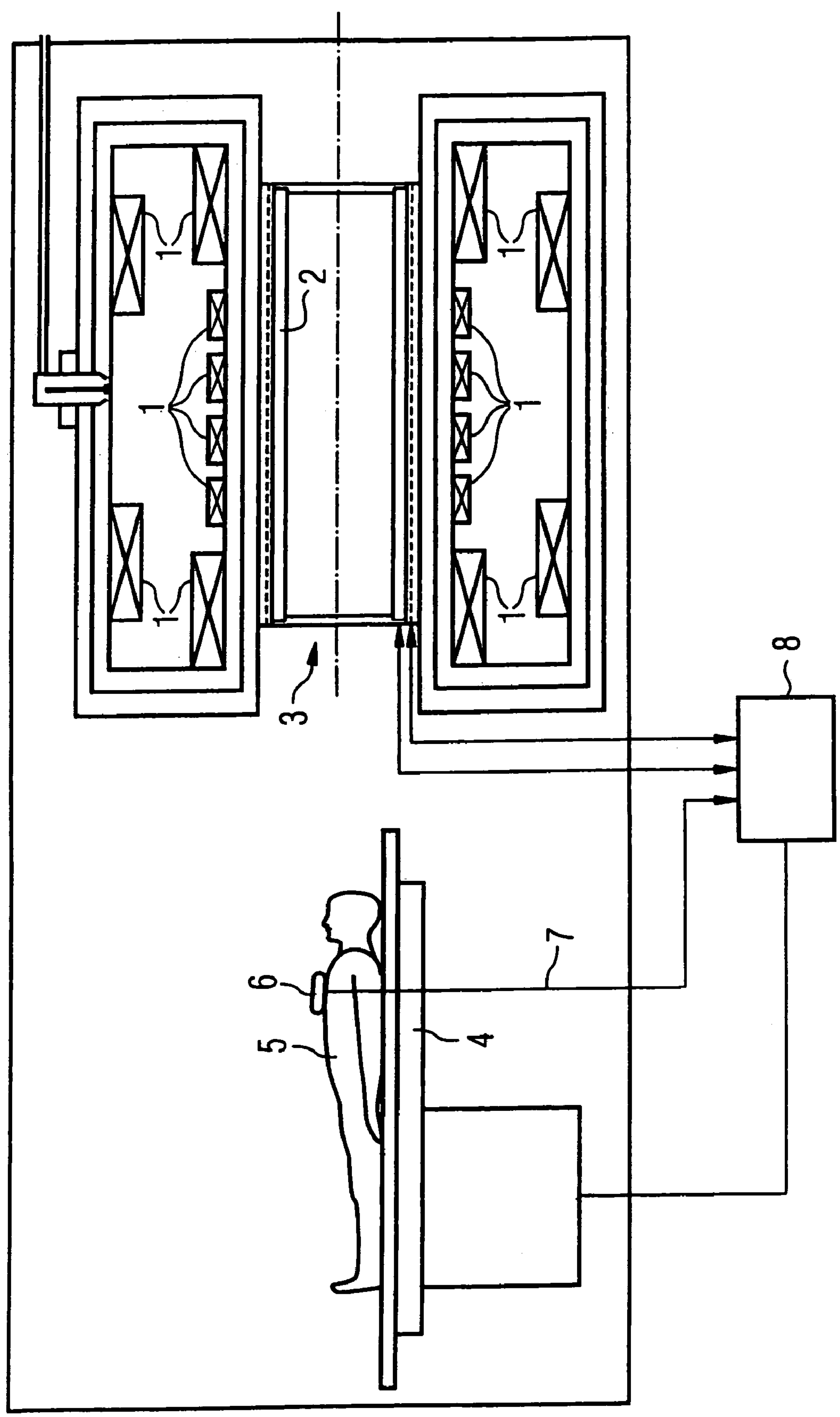
FIG. 1 schematically illustrates a magnetic resonance system.

As shown in FIG. 1, a magnetic resonance system has various magnet systems 1 and at least one transmission antenna 2 (here in the form of a whole-body antenna 2). The transmission antenna 2 defines an examination volume 3 that is normally essentially cylindrical. An examination subject 5 (normally a person) can be inserted into the examination volume 3 by means of a patient bed 4. A local coil 6 that is connected with a control and evaluation device 8 via a cable 7 can be arranged on the examination subject 5.

The transmission antenna (see FIG. 2) generates an alternating magnetic field B in the examination volume 3, this alternating magnetic field exhibiting an excitation frequency (namely the Larmor frequency). When the examination subject 5 is introduced into the examination volume 3 (i.e., is temporarily arranged therein), magnetic resonance signals are excited in the examination subject 5 at the excitation frequency. These excited magnetic resonance signals can be received by the whole-body antenna 2 (in the reception made) and/or by the local coil 6. The received magnetic resonances are supplied to the control and evaluation device 8 and are evaluated in a typical known manner.

Figure 2:
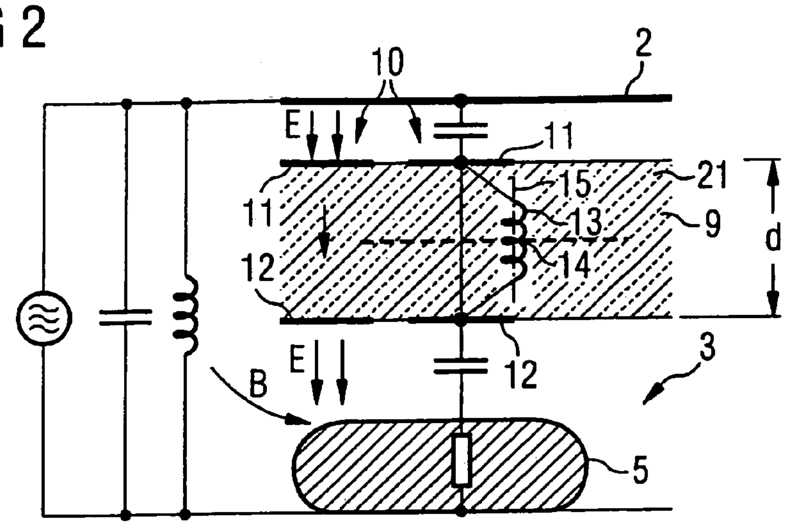
FIG. 2 is a circuit diagram representing certain of the items of FIG. 1.

Not only is the desired radio-frequency magnetic field is generated and radiated by the transmission antenna 2; but also an electrical field is generated that oscillates with the excitation frequency and is provided with the reference character E in FIG. 2. The transmission antenna 2—which is arranged in the surroundings of the examination volume 3—is thus at the same time also a radio-frequency source by means of which the electrical field E can be generated. This electrical field E would be capacitively coupled into the examination subject 5 if no countermeasures were taken. Shielding the subject 5 from this electrical field E is the object of the present invention.

The inventive magnetic resonance system has a barrier 9 for shielding the electrical field E. The barrier 9 is arranged between the radio-frequency source 2 and the examination volume 3. The examination volume 3 is shielded from the electrical field E generated by the radio-frequency source 2 by the barrier 9.

Figure 3:
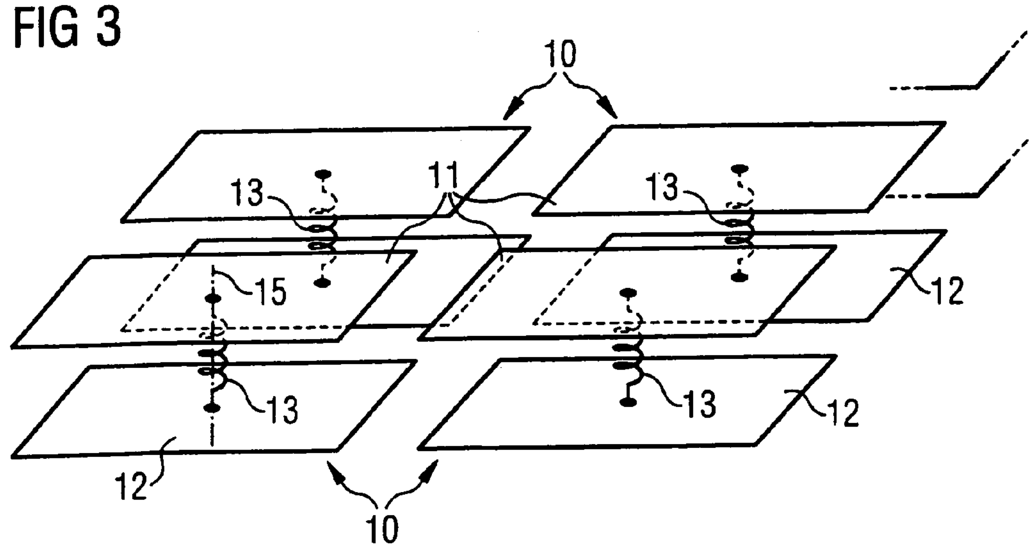
FIG. 3 illustrates a barrier in accordance with the invention.

The barrier 9 according to FIGS. 2 and 3 is formed by a number of individual resonators 10. According to FIGS. 2 and 3, each individual resonator 10 has two capacitor surfaces 11, 12 as well as a coil 13. The capacitor surfaces 11, 12 is respectively face toward the radio-frequency source 2 and the examination volume 3. The capacitor surfaces 11, 12 are connected with one another in an electrically-conductive manner via the coil 13. According to FIGS. 2 and 3, both the capacitor surface 11 facing toward the radio-frequency source 2 and the capacitor surface 12 facing toward the examination volume 3 are not directly connected with, one another in an electrically-conductive manner.

The capacitance indicated in FIG. 2 between the capacitor surface 11 and the radio-frequency source 2, the capacitance indicated between the capacitor surface 12 and the examination subject 5, and the resistance indicated in the examination subject 5 are not physically-present components, but merely illustrate the existing coupling.

The capacitor surfaces 11, 12 are separated from one another by a barrier thickness d and exhibit an effective area A. They form a plate capacitor with a capacitance C that is determined by the generally known formula $$C=\in_0\in_r\cdot A/d$$

wherein $\in_0$ is the absolute dielectric constant, $\in_r$ is the relative dielectric constant of the medium forming the barrier 9 is comprised.

In order to be able to optimally fulfill its shielding function, the barrier 9 should be resonant at the excitation frequency (the Larmor frequency). Each individual resonator 10 therefore should be resonant at the excitation frequency. The coils 13 thus should exhibit an inductance L that satisfies the condition $$L=1/\omega^2C$$

wherein ω is the excitation frequency multiplied by 2Π.

The individual resonators 10 are completely electrically separated from one another according to FIGS. 2 and 3. Alternatively, they can be connected with one another in an electrically-conductive manner, for example on the sides of the radio-frequency source 2 or of the examination volume 3.

Figure 5:
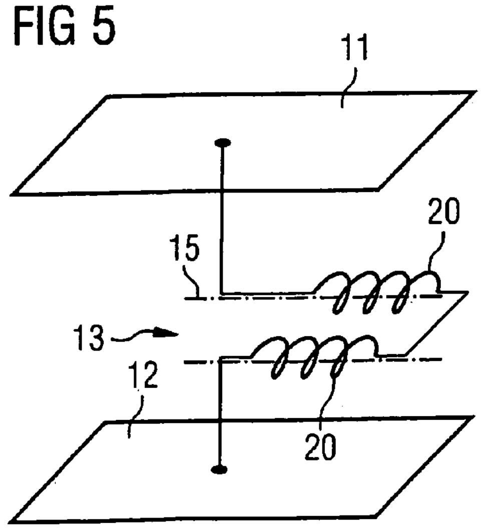
Figure 6:
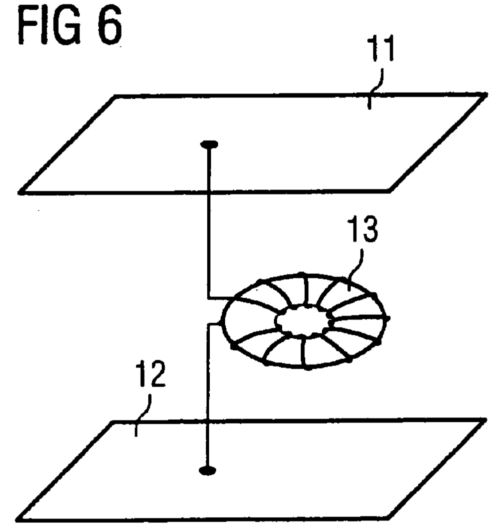

According to FIG. 3, which shows the simplest embodiment of the individual resonators 10, the capacitor surfaces 11, 12 are fashioned as simple rectangular (alternatively, for example, honeycomb-shaped or circular) areas 11, 12. Furthermore, the coils 13 exhibit coil axes 15 that are situated essentially perpendicular to the capacitor surfaces 11, 12. Although this embodiment of the individual resonators 10 is possible and very simple, it is still not optimal with regard to its shielding effect. In the subsequently-described FIG. 4 through 6, embodiments of individual resonators 10 are shown that are optimized with regard to their effect. The variations subsequently described in connection with the FIG. 4 through 6 can be realized independently of one another and also can be combined with one another insofar as they do not mutually contradict in the individual case.

Figure 4:
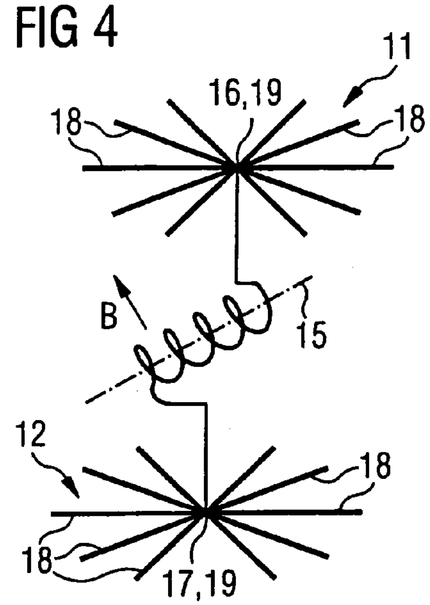
FIG. 4 through 6 show individual resonators in the inventive barrier.

According to FIG. 4, the capacitor surfaces 11, 12 are connected with the coils 13 via connection points 16, 17. The capacitor surfaces 11, 12 extend in essentially in one plane precisely they are "surfaces". Relative to the connection points 16, 17, they exhibit extensions 18 that radially extend in the plane, thus away from the connection points 16, 17. The extensions 18 are therefore not directly connected with one another in an electrically-conductive manner, but rather are only connected via a core region 19 of the respective contact surface 11, 12. Eddy currents that are induced in the capacitor surfaces 11, 12 can be reduced to a minimum via this embodiment of the capacitor surfaces 11, 12.

The size of the core regions 19 can be very small. In the extreme case, it is possible that the core regions 19 are identical with the connection points 16, 17. In this case the contact surfaces 11, 12 are star-shaped.

Furthermore, according to FIG. 4 the coil 13 is oriented such that its coil axis 15 is perpendicular to a rotation plane within which the magnetic field B oscillates. It is thereby achieved that no current can be induced in the coil 13 by the radio-frequency source 2 although the radio-frequency source 2 also emits the magnetic field B.

Situations can exist in which the arrangement of the coils 13 shown in FIG. 4 is not possible. For example, the orientation of a cable 7 or of a local coil 6 is not known beforehand in all cases. In spite of the radiation of an alternating magnetic field B by the radio-frequency source 2, it should also be possible in these cases to exclude an influence of the radio-frequency source 2 on the coils 13 of the individual resonators 10. This can be achieved via corresponding design of the coils 13. For this, the coils 13 are fashioned such that currents that are induced in the coils 13 by the alternating magnetic field B generate induction voltages that mutually compensate. In an embodiment of the coils 13 the coils 13 (see FIG. 5) are divided into two partial coils (sub-coils) 20 connected anti-parallel to one another. Alternatively, the coils 13 according to FIG. 6 could also be fashioned as toroids 13.

Figure 7:
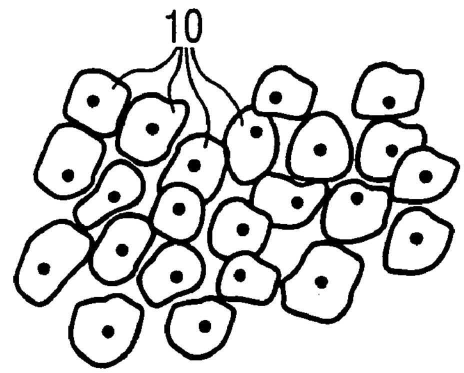
FIG. 7 through 9 show arrangements of individual resonators in the inventive barrier.
Figure 8:
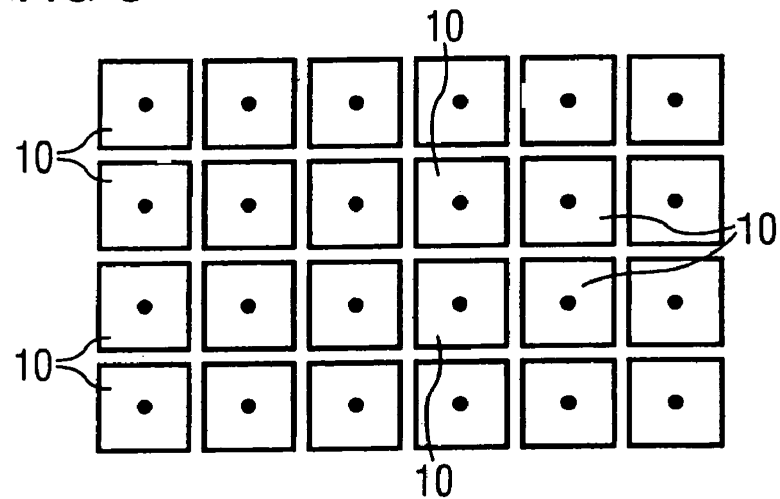
Figure 9:
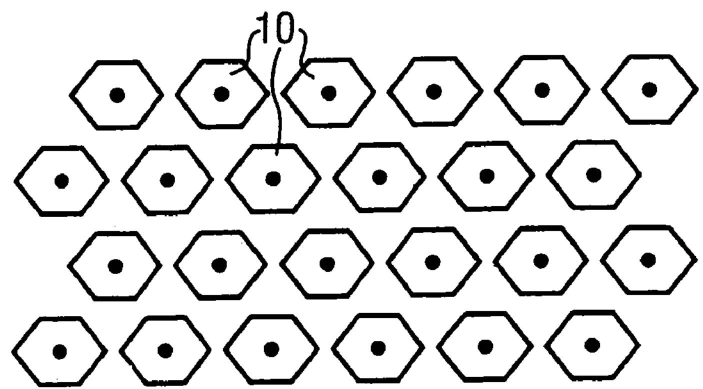

In principle, the individual resonators 10 can be arranged arbitrarily distributed within the barrier 9. For example, according to FIG. 7 they can be irregularly distributed. As is shown in FIGS. 8 and 9, they can also be regularly distributed. FIG. 8 shows individual resonators 10 that define a rectangular pattern. FIG. 9 shows Individual resonators 10 that define a hexagonal pattern.

Figure 10:
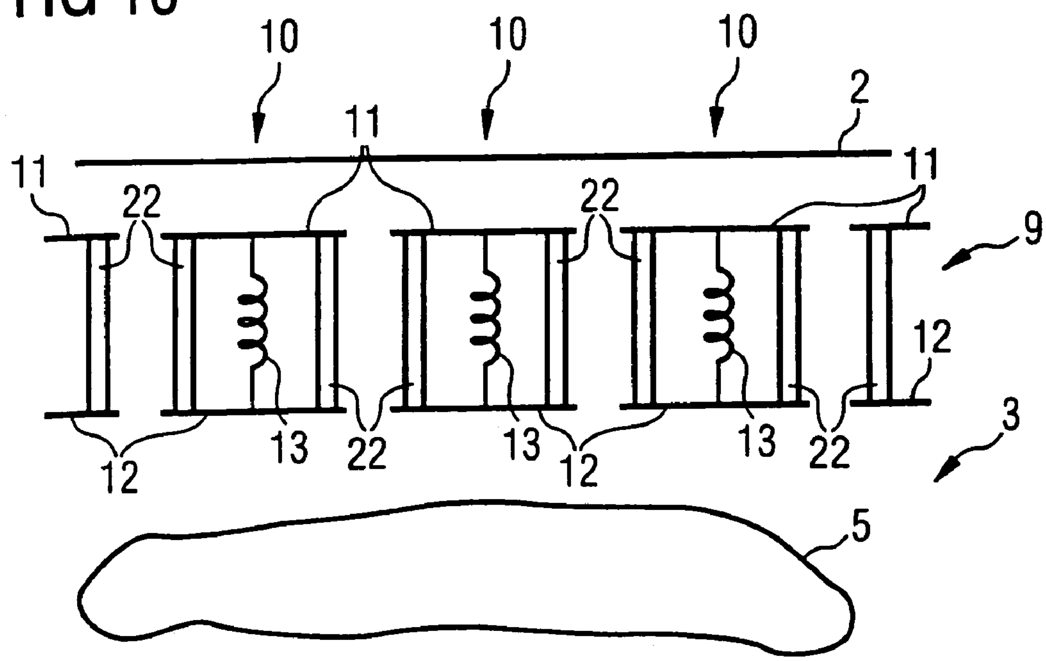
FIGS. 10 and 11 show alternative embodiments of the barrier shown in FIG. 2.
Figure 11:
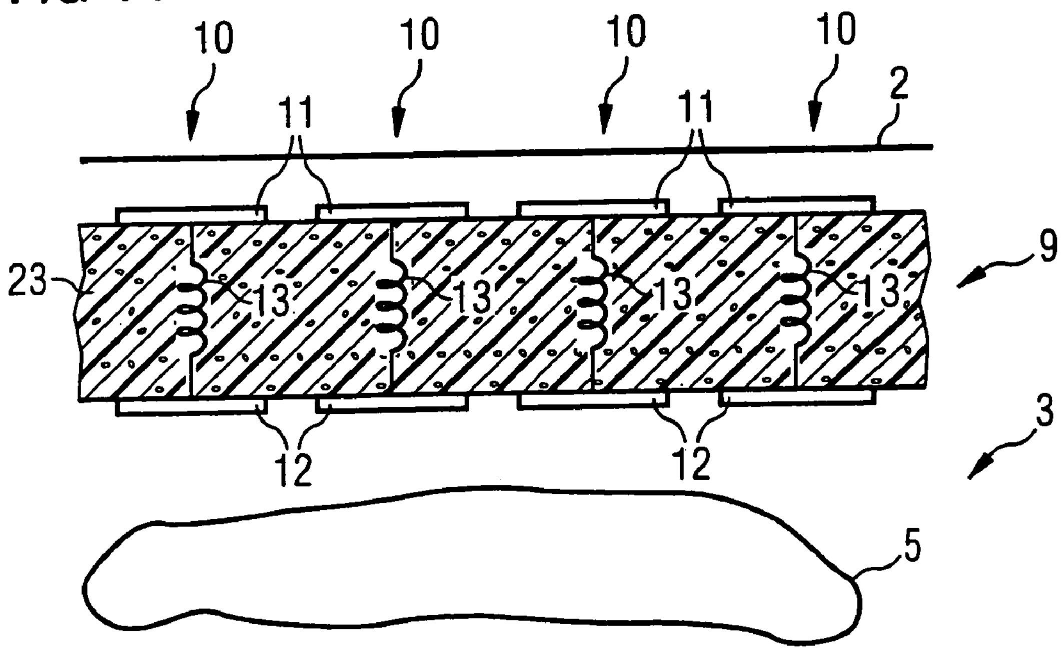

As can be seen from FIG. 2, a dielectric 21 is arranged between the capacitor surfaces 11, 12 of the individual resonators 10. The dielectric 21 extends over a number of individual resonators 10 and is fashioned (corresponding to the representation from FIG. 2) as a supporting structure 21 for the capacitor surfaces 11, 12 and the coils 13. It is also conceivable for essentially only air to be located between the capacitor surfaces 11, 12 of the individual resonators 10. For example, it is possible to provide spacers 22 according to FIG. 10. A supporting structure that is fashioned as a foamed material could also be used corresponding to FIG. 11, such that the supporting structure 23 itself is essentially composed of air.

The present invention was explained above in connection with a transmission antenna 2. This represents the most frequent and important application case, but the present invention is not limited to the application in a transmission antenna 2. It could also be applied in the individual case when the radio-frequency source is identical with the local coil 6 that is fashioned merely for excitation of magnetic resonances excited in the examination subject 5. It is even possible to provide the cable 7 for the local coil 6 with an inventive barrier 9. In each of these cases, an effective shielding of the examination volume 3 from a capacitive coupling of electrical fields that are generated by the respective radio-frequency source 2, 6, 7 is provided.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance system comprising:

a magnetic resonance scanner having an examination volume adapted to receive an examination subject therein;

a transmission antenna that emits radio frequency energy, at an excitation frequency, into the examination volume;

a radio frequency source disposed relative to said examination volume, said radio frequency source emitting an electrical field oscillating at said excitation frequency;

a barrier disposed between said radio frequency source and said examination volume to shield said examination volume from said electrical field generated by said radio frequency source; and said barrier being comprised of a plurality of individual resonators that each inherently resonate at said excitation frequency, each individual resonator comprising two capacitor surfaces, a first of said two capacitor surfaces facing said radio frequency source and a second of said two capacitor surfaces facing said examination volume, said first and second capacitor surfaces being electrically connected to each other via a coil, with said first and second capacitor surfaces not being otherwise electrically connected to each other.

2. A magnetic resonance system as claimed in claim 1 wherein said radio frequency source is said transmission antenna.

3. A magnetic resonance system as claimed in claim 1 wherein said radio frequency source is a local coil that receives magnetic resonant signals excited in said examination subject.

4. A magnetic resonant system as claimed in claim 1 wherein said radio frequency source is a cable connected to said transmission antenna.

5. A magnetic resonant system as claimed in claim 1 wherein, in each individual resonator, the first capacitor surface and the second capacitor surface are connected to the coil at respective connection points, and wherein the respective first capacitor surfaces of the individual resonators of said plurality of individual resonators are disposed in one plane, and wherein the respective second capacitor surfaces of the individual resonators of said plurality of individual resonators extend radially in said plane relative to said connection points.

6. A magnetic resonance system as claimed in claim 5 wherein each of said first and second capacitor surfaces in each of said individual resonators is star-shaped.

7. A magnetic resonance system as claimed in claim 1 wherein said individual resonators are irregularly distributed relative to said examination volume.

8. A magnetic resonance system as claimed in claim 1 wherein said individual resonators are regularly distributed relative to said examination volume.

9. A magnetic resonance system as claimed in claim 8 wherein said individual resonators define a rectangular pattern.

10. A magnetic resonance system as claimed in claim 8 wherein said individual resonators define a hexagonal pattern.

11. A magnetic resonance system as claimed in claim 1 wherein each individual resonator comprises a dielectric disposed between the first and second capacitor surfaces thereof.

12. A magnetic resonance system as claimed in claim 11 wherein said dielectric forms a supporting structure for the first and second capacitor surfaces and the coil of the individual resonator.

13. A magnetic resonance system as claimed in claim 11 wherein a number of said individual resonators in said plurality of individual resonators share a common dielectric that continuously extends in said number of individual resonators.

14. A magnetic resonance system as claimed in claim 1 wherein each individual resonator has substantially only air disposed between the first and second capacitor surfaces thereof.

15. A magnetic resonance system as claimed in claim 1 wherein said radio frequency source also emits an alternating magnetic field, and wherein the coil in each individual resonator is oriented so that said alternating magnetic field does not induce a current in the coil.

16. A magnetic resonance system as claimed in claim 1 wherein said radio frequency source also emits an alternating magnetic field that induces a current in respective coils of individual resonators in said plurality of individual resonators, and wherein the currents induced in the respective coils generate mutually compensating induction voltages.

* * * * *